(12) United States Patent
Beamish et al.

(10) Patent No.: US 7,187,314 B1
(45) Date of Patent: Mar. 6, 2007

(54) SYSTEM FOR REDUCING AMPLITUDE DIGITAL-TO-ANALOG CONVERTER (DAC) RESOLUTION IN A POLAR TRANSMITTER

(75) Inventors: Norman J. Beamish, Dublin (IE); Morten Damgaard, Laguna Hills, CA (US); John E. Vasa, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 11/241,141

(22) Filed: Sep. 30, 2005

(51) Int. Cl.
*H03M 1/66* (2006.01)
(52) U.S. Cl. .................................... 341/144
(58) Field of Classification Search ............... 341/144, 341/145, 146, 131, 150
See application file for complete search history.

(56) References Cited

U.S. PATENT DOCUMENTS

| | | | | |
|---|---|---|---|---|
| 6,504,863 | B1* | 1/2003 | Hellmark | 375/219 |
| 6,980,144 | B1* | 12/2005 | Maloberti et al. | 341/143 |
| 7,015,845 | B2* | 3/2006 | Pugel | 341/144 |

* cited by examiner

Primary Examiner—Brian Young

(57) ABSTRACT

A system for reducing digital-to-analog converter (DAC) resolution for an amplitude modulated signal comprises a first logic configured to determine a desired DAC output voltage range, a second logic configured to select a DAC reference voltage level corresponding to the desired DAC output voltage range, a third logic configured to select a number of digital bits for conversion to the analog domain, the number of bits chosen from a larger number of digital bits, and a DAC configured to receive the selected DAC reference voltage level and convert the selected number of digital bits to a signal in the analog domain.

18 Claims, 8 Drawing Sheets

SYSTEM FOR REDUCING AMPLITUDE DIGITAL-TO-ANALOG CONVERTER (DAC) RESOLUTION IN A POLAR TRANSMITTER

BACKGROUND

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical GSM mobile communication system using narrowband TDMA technology, a GMSK modulation scheme supplies a very clean phase modulated (PM) transmit signal to a non-linear power amplifier directly from an oscillator.

In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which the transmitted signal contains both a PM component and an amplitude modulated (AM) component. Standards such as these increase the data rate without increasing the bandwidth of the transmitted signal. Unfortunately, existing GSM modulation schemes are not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the control port of the power amplifier.

When attempting to include a PM component and an AM component in a GSM type modulation system, the power control loop will attenuate the amplitude variations present in the signal in an attempt to maintain a constant output power. In such an arrangement, the power control loop tends to cancel the AM portion of the signal.

In such systems in which transmit signals contain both PM and AM components, the output power can be controlled by applying a predetermined control voltage to the power amplifier. Unfortunately, this requires the use of a highly linear, and therefore comparatively inefficient, power amplifier. In non-burst transmission systems the output power may be controlled by a feedback loop having a time-constant that is very low compared to the time-constant of the amplitude variations of the modulator. Another known method to control the output power is to "pre-distort" the modulated signal in such a way that the power control loop will cancel the effect of the pre-distortion. In such a method, the amplitude information is passed through a transfer function that is the inverse of the power control loop transfer function. Unfortunately, these methods are costly and inefficient.

Known multi-mode transmitter architectures require multiple variable elements, which are chosen depending upon the desired transmit mode. These architectures are complex, unreliable, require periodic calibration, and cannot support multiple transmission standards without significant adjustments to the supporting analog and digital circuitry.

Further, in those transmission standards in which the signal to be transmitted by the power amplifier contains both phase modulation and amplitude modulation, unless the power amplifier is very linear, it may distort the combined transmission signal by causing undesirable AM to PM conversion. This conversion is detrimental to the transmit signal and can require the use of a costly and inefficient linear power amplifier.

Further still, in transmission systems in which a combined AM and PM signal is used in a power control loop having a wide range of power output levels and to meet strict GSM/enhanced data rates for GSM evolution (EDGE) spectral emissions limitations, a high level of precision is typically required when converting the amplitude modulated portion of the transmit signal from the digital domain to the analog domain. This typically requires a digital-to-analog converter (DAC) having 12 bit resolution with a sampling rate of approximately 4 MHz. Such a DAC is costly to implement, both with respect to area on the circuit and power consumption.

SUMMARY

A system for reducing digital-to-analog converter (DAC) resolution for an amplitude modulated signal comprises a first logic configured to determine a desired power level, a second logic configured to select a DAC reference voltage level corresponding to the desired power level, a third logic configured to select a number of digital bits for conversion to the analog domain, the number of bits chosen from a larger number of digital bits, and a DAC configured to receive the selected DAC reference voltage level and convert the selected number of digital bits to a signal in the analog domain.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
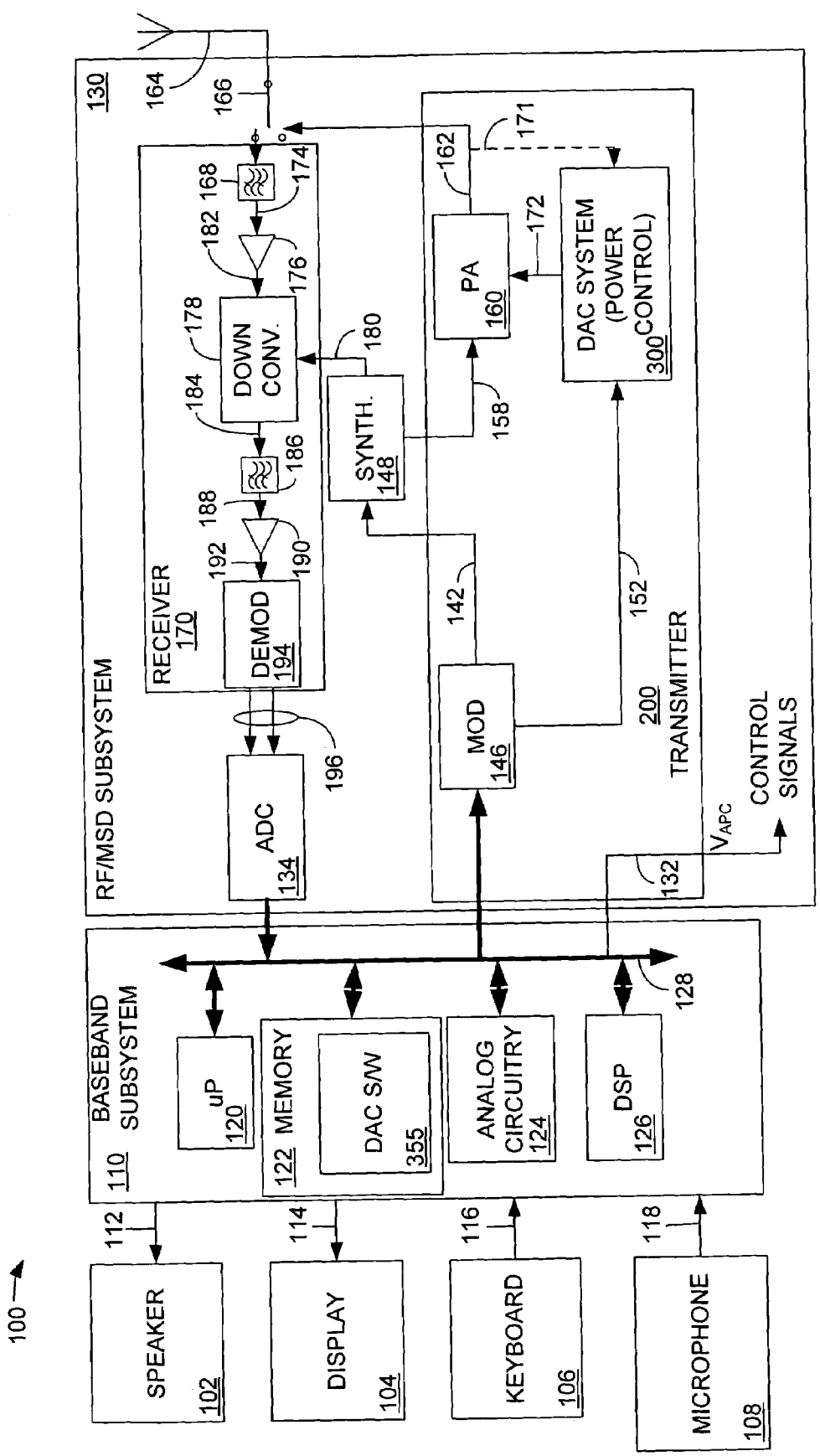
FIG. 1 is a block diagram illustrating a simplified portable transceiver.

Although described with particular reference to a portable transceiver, the system for reducing amplitude DAC resolution can be implemented in any system where a high level of precision is typically required when converting the amplitude modulated portion of the transmit signal from the digital domain to the analog domain.

The system for reducing amplitude DAC resolution can be implemented in hardware, software, or a combination of hardware and software. When implemented in hardware, the system for reducing amplitude DAC resolution can be implemented using specialized hardware elements and logic. When the system for reducing amplitude DAC resolution is implemented partially in software, the software portion can be used to precisely determine and control the reference signal delivered to the DAC that converts the digital representation of the amplitude modulated (AM) signal to the digital domain. The software can be stored in a memory and executed by a suitable instruction execution system (microprocessor). The hardware implementation of the system for reducing amplitude DAC resolution can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system for reducing amplitude DAC resolution comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. The portable transceiver 100 includes speaker 102, display 104, keyboard 106, and microphone 108, all connected to baseband subsystem 110. In a particular embodiment, the portable transceiver 100 can be, for example but not limited to, a portable telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes microprocessor ($\mu$P) 120, memory 122, analog circuitry 124, and digital signal processor (DSP) 126 in communication via bus 128. The bus 128, though shown as a single bus, may be implemented using a number of busses connected as necessary among the subsystems within baseband subsystem 110. The microprocessor 120 and the memory 122 provide the signal timing, processing and storage functions for the portable transceiver 100. If portions of the system for reducing amplitude DAC resolution are implemented in software, then the memory 122 also includes DAC software 355 that can be executed by the microprocessor 120, the DSP 126 or by another processor.

The analog circuitry 124 provides the analog processing functions for the signals within the baseband subsystem 110. The baseband subsystem 110 communicates with the radio frequency (RF)/mixed signal device (MSD) subsystem 130 via the bus 128.

The RF/MSD subsystem 130 includes both analog and digital components. For example, the RF/MSD subsystem 130 includes a transmitter 200, a receiver 170, an analog-to-digital converter 134, and a DAC system 300. In this embodiment, as will be described below, the DAC system 300 operates essentially as a power control element for the power amplifier 160.

In an embodiment, the baseband subsystem 110 provides an automatic power control signal (supplied as an analog voltage signal and referred to as $V_{APC}$) to the RF/MSD subsystem 130. Although shown as a single connection 132, the control signals may originate from the DSP 126 from microprocessor 120, or from another element, and are supplied to a variety of points within the RF/MSD subsystem 130. It should be noted that, for simplicity, only the basic components of portable transceiver 100 are illustrated.

The ADC 134 and a modulator 146 also communicate with microprocessor 120, memory 122, analog circuitry 124 and DSP 126 via bus 128. The modulator 146 provides digital phase information and digital amplitude information. In accordance with an embodiment of the system for reducing amplitude DAC resolution, and as will be described in detail below, the DAC system 300 is operated with a variable reference voltage that is chosen to correspond with the desired output power level of the transmitted signal. Depending on the desired output level, the DAC system 300 operates at a plurality of resolution levels, allowing the resolution of the DAC system 300 to be selected based on system requirements, on a burst by burst basis.

The DAC system 300 may operate on either baseband in-phase (I) and quadrature-phase (Q) components or phase and amplitude components of the information signal. In the case of I and Q components, the modulator 146 is an I/Q modulator as known in the art while in the case of phase and amplitude components, the modulator 146 operates as a phase modulator utilizing only the phase component and passes the amplitude component, unchanged, to the DAC system 300.

The modulator 146 modulates either the I and Q information signals or the phase information signal received from the baseband subsystem 110 onto an LO signal and provides digital phase information via connection 142 to a synthesizer 148 and provides digital amplitude information via connection 152 to the DAC system 300.

The synthesizer 148 determines the appropriate frequency to which the digital phase information signal will be applied and supplies the modulated digital phase information to the power amplifier 160 via connection 158.

The power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

In an embodiment, a portion of the amplified transmit signal power on connection 162 can be supplied via connection 171 to a power control element. In such an embodiment the power control element forms a continuous closed power control feedback loop and supplies an information signal on connection 172 instructing the power amplifier 160 as to the power to which the signal on connection 158 should be amplified. In another embodiment, the power control element operates in an open loop configuration where the connection 171 is not present.

A signal received by antenna 164 may, at the appropriate time determined by the baseband subsystem 110, be directed via switch 166 to a receive filter 168. The receive filter 168 filters the received signal and supplies the filtered signal on connection 174 to a low noise amplifier (LNA) 176. The receive filter 168 may be a bandpass filter that passes all channels of the particular cellular system where the portable transceiver 100 is operating. As an example, for a 900 MHz GSM system, receive filter 168 would pass all frequencies from 935.1 MHz to 959.9 MHz, covering all 125 contiguous channels of 200 kHz each. The purpose of the receive filter 168 is to reject all frequencies outside the desired region. An LNA 176 amplifies the very weak signal on connection 174 to a level at which downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB).

The downconverter 178 receives an LO signal from synthesizer 148 via connection 180. The LO signal determines the frequency to which to downconvert the signal received from the LNA 176 via connection 182. The downconverted frequency is called the intermediate frequency (IF). The downconverter 178 sends the downconverted signal via connection 184 to a channel filter 186, also called the "IF filter." The channel filter 186 filters the downconverted signal and supplies it via connection 188 to an amplifier 190. The channel filter 186 selects the one desired channel and rejects all others. Using the GSM system as an example, only one of the 125 contiguous channels is actually to be received. After all channels are passed by the receive filter 168 and downconverted in frequency by the downconverter 178, only the one desired channel will appear precisely at the center frequency of channel filter 186. The synthesizer 148, by controlling the local oscillator frequency supplied on connection 180 to downconverter 178, determines the selected channel. The amplifier 190 amplifies the received signal and supplies the amplified signal via connection 192 to demodulator 194. The demodulator 194 recovers the transmitted analog information and supplies a signal representing this information via connection 196 to the ADC 134. The ADC 134 converts these analog signals to a digital signal at baseband frequency and transfers it via bus 128 to DSP 126 for further processing.

Figure 2:
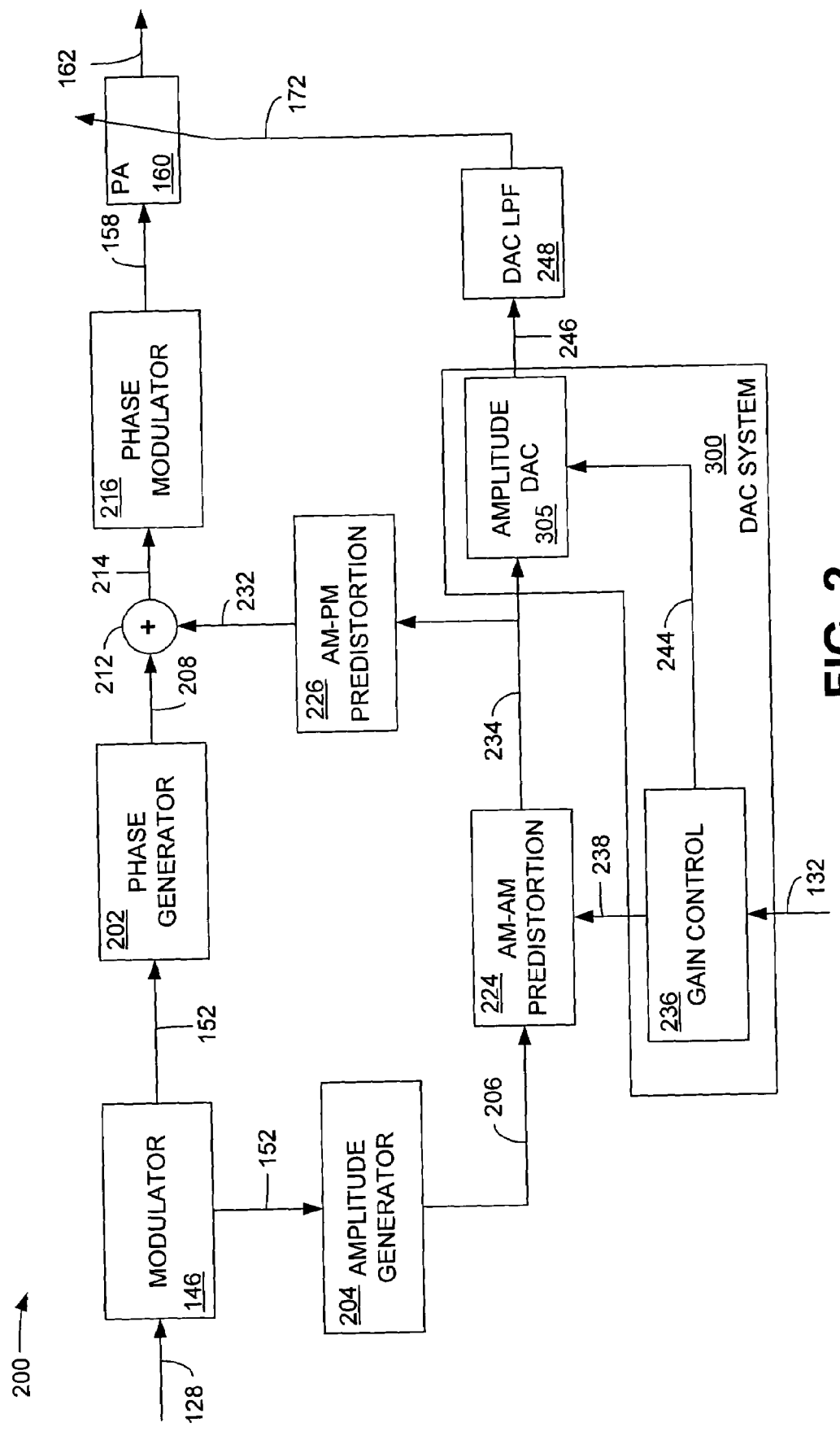
FIG. 2 is a block diagram illustrating a polar RF transmitter associated with a digital-to-analog converter (DAC) system in accordance with an embodiment of the invention.

FIG. 2 is a block diagram illustrating a polar RF transmitter 200 associated with a digital-to-analog converter (DAC) system 300 in accordance with an embodiment of the invention.

In the embodiment illustrated in FIG. 2 an I/Q modulator 146 generates a pair of IQ information signals in either the GSM or EDGE format. One copy of these IQ information signals is sent via connection 152 to a phase generator 202, which, upon being presented with an IQ signal pair at its input, will generate the phase of that IQ signal pair at its output on connection 208. A duplicate copy of the IQ signal pair from the modulator 146 is sent via connection 152 to an amplitude generator 204. The amplitude generator 204 produces at its output on connection 206 a signal corresponding to the amplitude of the IQ signal pair at its input on connection 152. The operation of the phase generator 202 and the amplitude generator 204 is well known in the art.

The output of the phase generator 202 is added in the adder 212 to a phase offset value generated by an AM-PM predistortion element 226. The output of the adder 212 is supplied via connection 214 to a phase modulator 216. The AM-PM predistortion element 226 will be discussed in more detail below. The phase modulator 216 uses the phase input on connection 214 to modulate the phase of an RF signal centered at an RF carrier frequency, which is determined externally to the transmitter 200 by the baseband subsystem 110. The output of the phase modulator 216 is sent to the signal input of the power amplifier 160. An optional filtering or impedance matching stage may be located between the output of the phase modulator 216 and the input of the power amplifier 160. An RF signal at the signal input of the power amplifier 160 on connection 158 will produce a corresponding RF signal at the output 162 of the power amplifier 160 with an amplitude change corresponding to an amplification factor that is selected for the power amplifier 160. The amplification factor of the power amplifier 160 is determined by the voltage level at the gain control input 172 of the power amplifier 160.

The output of the amplitude generator 204 on connection 206 is passed to an AM—AM predistortion element 224, which modifies its input to produce an output that is sent to an amplitude DAC 305. The amplitude DAC 305 and a gain control element 236 comprise the DAC system 300. The AM—AM predistortion element 224 will be discussed in more detail below. The amplitude DAC 300 takes a digital input on connection 234 and converts it into an analog voltage at the input to the amplitude DAC LPF (lowpasss filter) 248 on connection 246. In this embodiment, the signal on connection 234 is a 12 bit digital amplitude information signal. The output of the amplitude DAC LPF 248 is connected to the gain control input of the power amplifier via connection 172.

When the power amplifier 160 exhibits an ideal linear input-output characteristic the RF signal at the signal input 158 of the power amplifier 160 will be linearly related to the signal at the output of the power amplifier 160 on connection 162 with only a scaling difference between the two. The scaling difference is determined by the amplification factor selected by the signal at the gain control input 172 of the power amplifier 160. In operation, the input-output characteristic of the power amplifier 160 will deviate from being absolutely linear. Characterization of the non-linear nature of a power amplifier can be done in a number of ways. A well known and well understood method to characterize a power amplifier is in terms of its AM—AM and AM-PM distortion characteristics. In this context the term AM—AM distortion describes the distortion of the amplitude modulation that results when the amplification factor of the power amplifier 160 does not change linearly with changes in the signal at the gain control input 172 of the power amplifier 160. The term AM-PM refers to distortion that is present when there is a phase offset between the RF signal at the signal input 158 of the power amplifier 160 and the RF signal at the output 162 of the power amplifier 160. This phase offset exhibits a dependency on the amplitude of the signal at the gain control input 172 of the power amplifier 160.

The effect of AM—AM and AM-PM distortion is to degrade the spectral characteristics of the RF signal at the output of the power amplifier 160. This degradation can cause a communication system to fail to meet specified performance requirements. In order to ameliorate the impact of AM—AM and AM-PM distortion, a well known technique is to apply AM—AM and AM-PM predistortion to the amplitude and phase components as shown in FIG. 2. The AM—AM and AM-PM predistortion characteristics can be determined either by analysis of the signal at the output of the power amplifier when a known signal is applied at the inputs of the power amplifier or by analysis of the design of the power amplifier. The approach in the latter case is inflexible and does not compensate for deviations introduced in the manufacturing process. The approach in the former case can be implemented in either a dynamic or a static fashion. In the static case the AM—AM and AM-PM characteristics of the power amplifier are determined as part of the manufacturing process and stored for later use while in the dynamic case the AM—AM and AM-PM characteristics of the power amplifier are continuously updated based on observations of the signal at the output of the power amplifier 160.

The desired transmit power level signal is supplied from connection 132 to the gain control element 236. The output of the gain control element 236 is provided on connection 238 to the AM—AM predistortion element 224 and on connection 244 to the amplitude DAC 305. The output of the gain control element 236 on connection 244 determines the reference level at which the amplitude DAC 305 will operate and will be described in greater detail below in FIG. 3.

Figure 3:
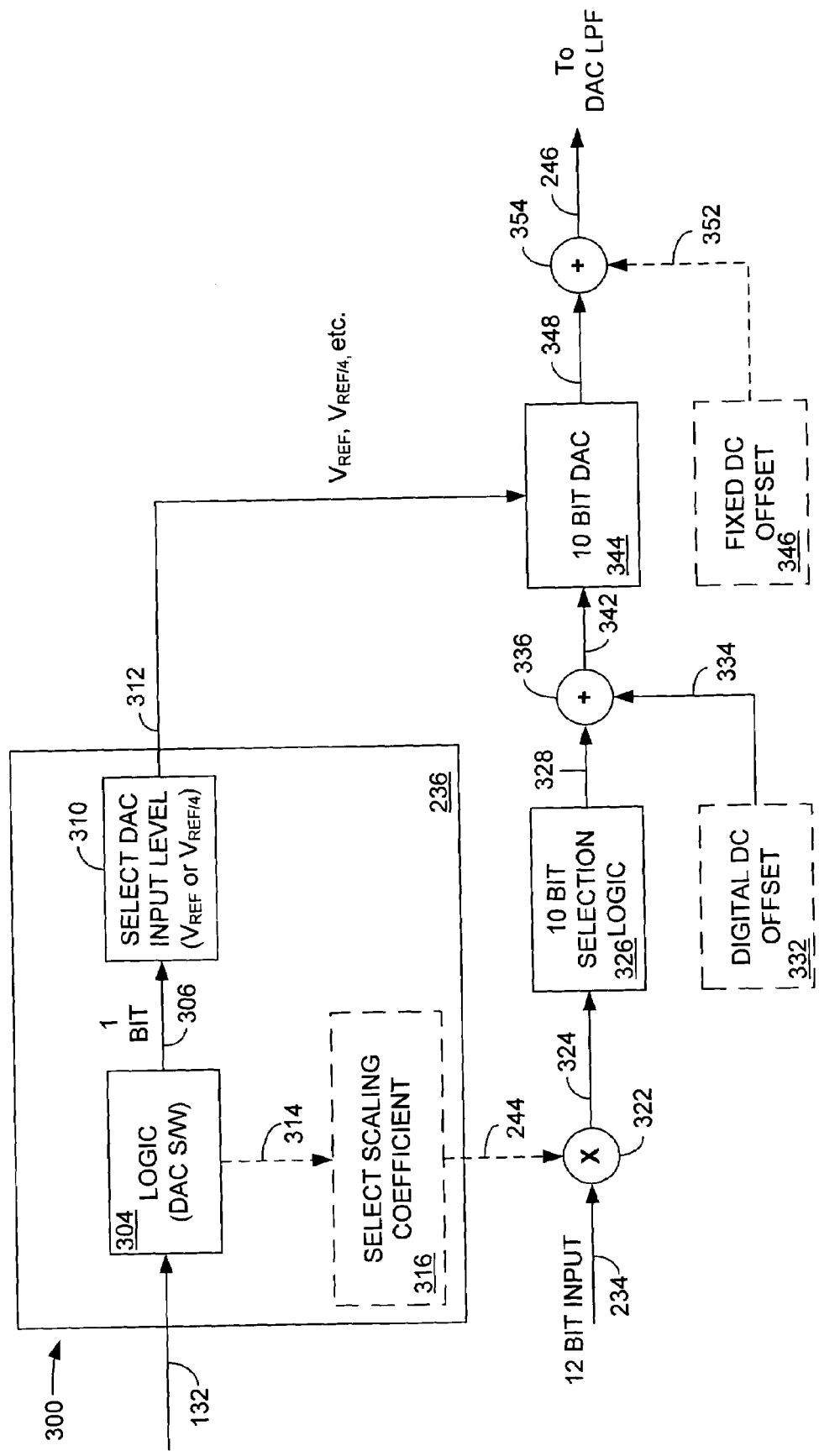
FIG. 3 is a block diagram illustrating the DAC system of FIG. 2.

FIG. 3 is a block diagram illustrating the DAC system 300 of FIG. 2. The DAC system 300 receives the digital I and Q information signal representing the amplitude as an input from the baseband subsystem 110 on connection 234, and a signal containing the desired transmit power on connection 132. The signal on connection 132 contains the desired power level to which the power amplifier 160 is to amplify a particular burst of transmit data. The desired power level signal on connection 132 is supplied to the DAC logic 304. The DAC logic 304 analyzes the desired power level signal on connection 302 and sends a signal representing the desired power level to DAC input level selection logic 310. In one embodiment, the signal on connection 306 may be a one (1) bit signal.

The DAC input level selection logic 310 selects the desired DAC voltage input level from a range of possible values based on the desired transmit power level for a given burst. For example, in one embodiment, the DAC input level selection logic 310 may select from a reference voltage level $V_{REF}$ or $V_{REF/4}$ depending on the desired power level. The voltage level $V_{REF}$ corresponds to the maximum available system voltage that can be provided to the elements in the portable transceiver 100 and is meant to be relative with respect to other reference voltage levels, such as $V_{REF/4}$. In an embodiment in which two possible DAC reference voltage levels are implemented, desired output power levels between 15 and 27 dBm correspond to a maximum DAC reference voltage level $V_{REF}$ and output power levels between 0 and 14 dBm correspond to a DAC reference voltage level of $V_{REF/4}$. Other DAC voltage reference levels are possible. By selecting the DAC reference voltage level based on the desired power amplifier output level, the resolution of the amplitude DAC 305 (FIG. 2) can be relaxed for lower output power levels, thereby consuming less power and allowing the use of a lower resolution DAC when power levels permit.

The DAC logic 304 optionally communicates via connection 314 with a scaling coefficient logic 316. The scaling coefficient logic 316 develops a signal on connection 244 that is representative of the desired power level and digitally compensates for inaccuracies among the various DAC reference voltage levels (in this example $V_{REF}$ and $V_{REF/4}$) due to manufacturing and tolerance variances. The output of the scaling coefficient logic 316, when implemented, is supplied via connection 244 to a multiplier 322. The DAC logic 304, DAC input level selection logic 310, and, if present, the scaling coefficient logic 316, comprise the gain control element 236 of FIG. 2.

The multiplier 322 receives a 12 bit input signal on connection 234 from the AM—AM predistortion element 224 (FIG. 2). The 12 bit signal on connection 234 contains the amplitude information signal to be transmitted in a particular burst. However, while 12 bits are used to represent all possible EDGE amplitude levels, the EDGE signal can be adequately represented using 10 bits in an individual burst. By setting the transmit power level at a given point, a 10 bit DAC resolution is sufficient to meet the GSM/EDGE adjacent channel power ratio (ACPR) specification at that transmitted power level. By dividing the transmit power output range into segments (in this example 0–14 dBm and 15–27 dBm), within each segment it is possible to meet the ACPR specification using, in this example, a DAC having a resolution lower than 12 bits. By knowing the desired power level for each burst, the DAC reference voltage level can be set on a burst by burst basis, allowing a 10 bit DAC to provide sufficient resolution so that the transmitter meets the ACPR specification at the particular selected power level for that burst. The signal on connection 234 represents the normalized power of the amplitude level of the burst on connection 234. The output of the multiplier 322 on connection 324 is supplied to the 10 bit selection logic 326. If the scaling coefficient logic 316 is not implemented, then the 12 bit signal on connection 234 is delivered directly to the 10 bit selection logic 326.

The 10 bit selection logic 326 chooses 10 bits out of the 12 bits supplied on connection 234 that represent the amplitude level of the signal for a particular burst. One manner of selecting the 10 most significant bits (MSBs) is to discard the two least significant bits (LSBs) and thereby truncate the original 12 bit word. Alternatively, the 12 bit word can be rounded to a 10 bit word by adding one LSB to the 10 bit word when the two discarded LSBs represent a number greater than one half of an LSB of the truncated word. The output of the 10 bit selection logic 326 is supplied to an adder 336. A digital DC offset element 332 optionally provides a DC offset correction signal on connection 334. The signal on connection 334 is added with the output of the 10 bit selection logic 326 and supplied to a 10 bit DAC 344. The 10 bit DAC 344 receives the reference voltage output of the DAC input level selection logic 310 via connection 312. A typical sampling rate for the 10 bit DAC 344 is 4.333 MHz. The output of the 10 bit DAC 344 on connection 348 is a 10 bit signal representing the amplitude level of the burst and the amplitude information to be transmitted. Alternatively, a DAC having a resolution of fewer than 10 bits may also be used by increasing the sampling rate.

Optionally, a fixed DC offset element 346 supplies an additional DC offset correction signal via connection 352, which is combined with the output of the 10 bit DAC in adder 354. The fixed DC offset element 346 allows the dynamic range of the DAC system 300 to be further reduced. The output of the adder 354 is supplied to the amplitude DAC LPF 248 (FIG. 2) and ultimately supplied as the amplitude level signal on connection 172 (FIG. 2). The functions of the DAC logic 304, the DAC input level selection logic 310, the scaling coefficient logic 316, the 10 bit selection logic 326, the digital DC offset element 332 and the fixed DC offset element 346 can be controlled by the DAC software 355 of FIG. 1.

Figure 4:
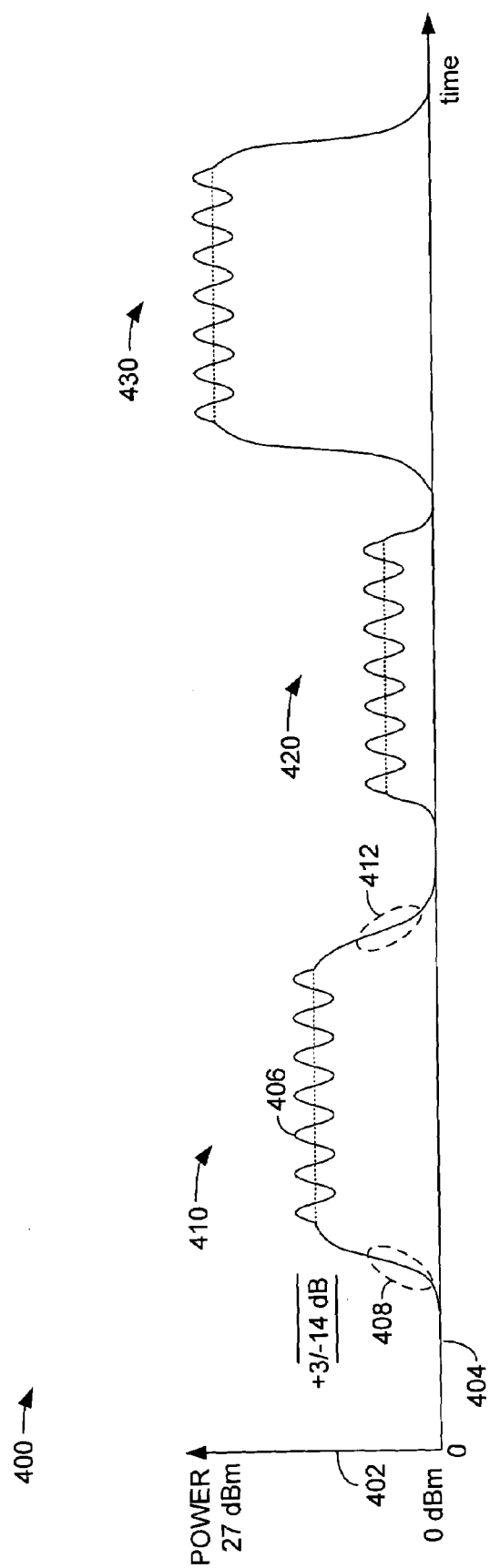
FIG. 4 is a graphical illustration showing a series of transmit bursts at different power levels.

FIG. 4 is a graphical illustration 400 showing a series of transmit bursts at different power levels. The vertical axis 402 represents transmitter output power and the horizontal axis 404 represents time. The power levels illustrated are relative for each burst. A first transmit burst 410 comprises a ramp up portion 408, during which time amplitude modulation may or may not be present, a transmit portion 406 during which time there is amplitude modulation, and a ramp down portion 412, during which time amplitude modulation may or may not be present. In this example, the power level of the first transmit burst 410 occurs at a power level between 0 dBm and 27 dBm. During the first transmit burst 410 the amplitude modulation occurs within a power range of +3 and −14 dB during the transmit portion 406. By knowing the power level of the first transmit burst 410, the DAC logic 304 and the DAC input level selection logic 310 selects the DAC reference voltage level appropriate for the desired transmit power level. For example, if the transmit power level of the burst 410 is between 0 and 14 dBm, the DAC input level selection logic 310 selects the DAC reference voltage level at $V_{REF/4}$. If the transmit power level of the burst 410 is between 15 and 27 dBm, the DAC input level selection logic 310 selects the DAC reference voltage level at $V_{REF}$.

A second transmit burst 420 and a third transmit burst 430 are illustrated to show that the power level of the transmit signal changes from burst to burst. By knowing the power level of the second transmit burst 420 and subsequent transmit bursts, the DAC logic 304 and the DAC input level selection logic 310 select the DAC reference voltage level appropriate for the desired transmit power level for each burst. In this manner, a lower resolution DAC (10 bit in this example) can be used and still allow the transmit power level to meet the ACPR specification for each burst.

Figure 5A:
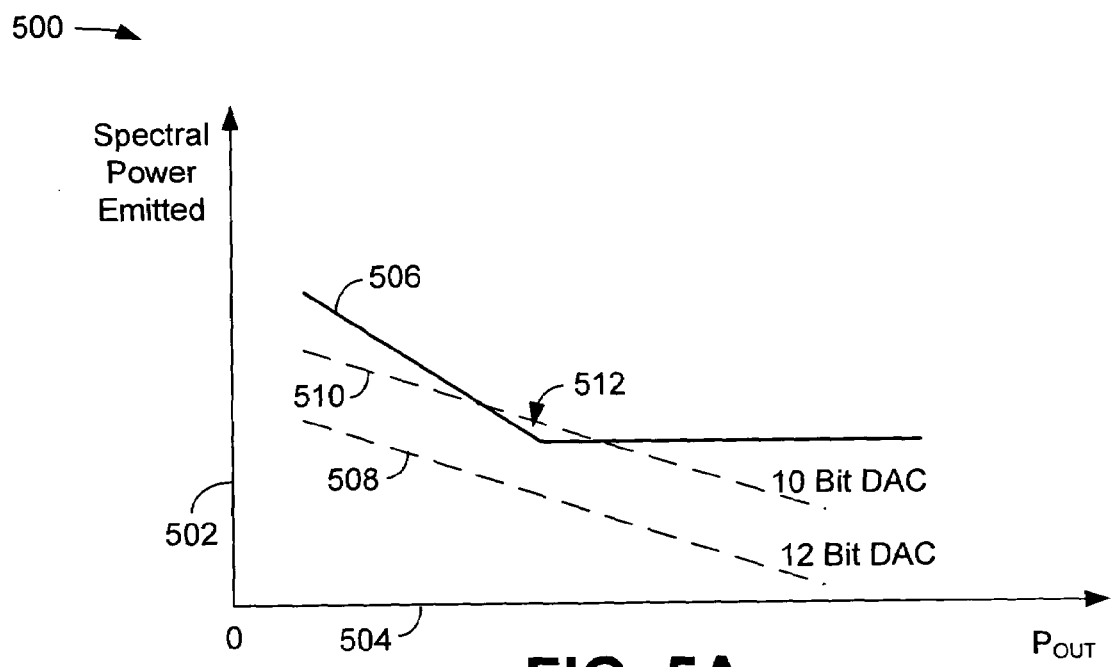
FIGS. 5A and 5B are graphical illustrations collectively showing the operation of an embodiment of the system for reducing amplitude DAC resolution.
Figure 5B:
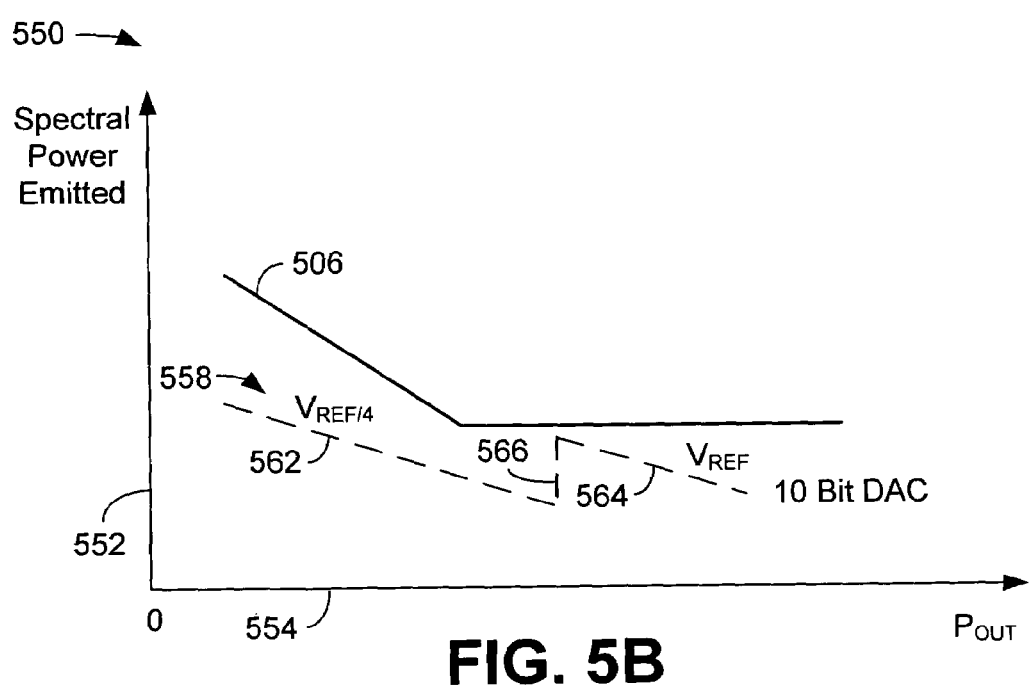

FIGS. 5A and 5B are graphical illustrations collectively showing the operation of the system for reducing amplitude DAC resolution. With regard to FIG. 5A, the graphical illustration 500 includes a vertical axis 502 depicting the spectral power emitted from the portable transceiver 100 and a horizontal axis 504 depicting the total power output, POUT, of the power amplifier 160. The curve 506 represents the spectral mask at a specified frequency offset from the carrier frequency, in this case an offset of 400 kHz, below which the spectral power emitted from the portable transceiver 100 must remain.

The curve 508 illustrates the spectral power at the specified frequency offset emitted from the portable transceiver 100 when a 12 bit DAC is used to convert the digital information signal to the analog domain and the curve 510 illustrates the spectral power at the specified frequency offset emitted from the portable transceiver 100 when a 10 bit DAC is used to convert the digital information signal to the analog domain. The region 512 illustrates a portion of the output power range where the spectral power at the specified frequency offset emitted form the portable transceiver 100 violates the mask 506 when a 10 bit DAC is used.

FIG. 5B is a graphical illustration 550 showing the effect on emitted spectral power at the specified frequency offset when the system for reducing amplitude DAC resolution is employed. The vertical axis 552 represents the spectral power at the specified frequency offset emitted from the portable transceiver 100 and the horizontal axis 554 represents the total power output, $P_{OUT}$, of the power amplifier 160. The curve 558 represents the spectral power at the specified frequency offset emitted from the portable transceiver 100 when the variable reference voltage signal described above is supplied to a 10 bit DAC. The portion 562 of the curve 558 illustrates the operation of the 10 bit DAC with the DAC reference voltage set to, in this example, $V_{REF/4}$ and the portion 564 of the curve 558 illustrates the operation of the 10 bit DAC with the DAC reference voltage set to, in this example, $V_{REF}$. The point illustrated at 566 illustrates the power level at which the reference voltage supplied to the DAC 344 is switched from $V_{REF/4}$ to $V_{REF}$. The switch in DAC reference voltage level occurs, in this example, when the desired transmit power level goes from 14 dBm to 15 dBm. In this manner, a DAC having a resolution lower than 12 bits can be used to reduce power consumption and device area, while still meeting the GSM/EDGE spectral emission requirements.

Figure 6:
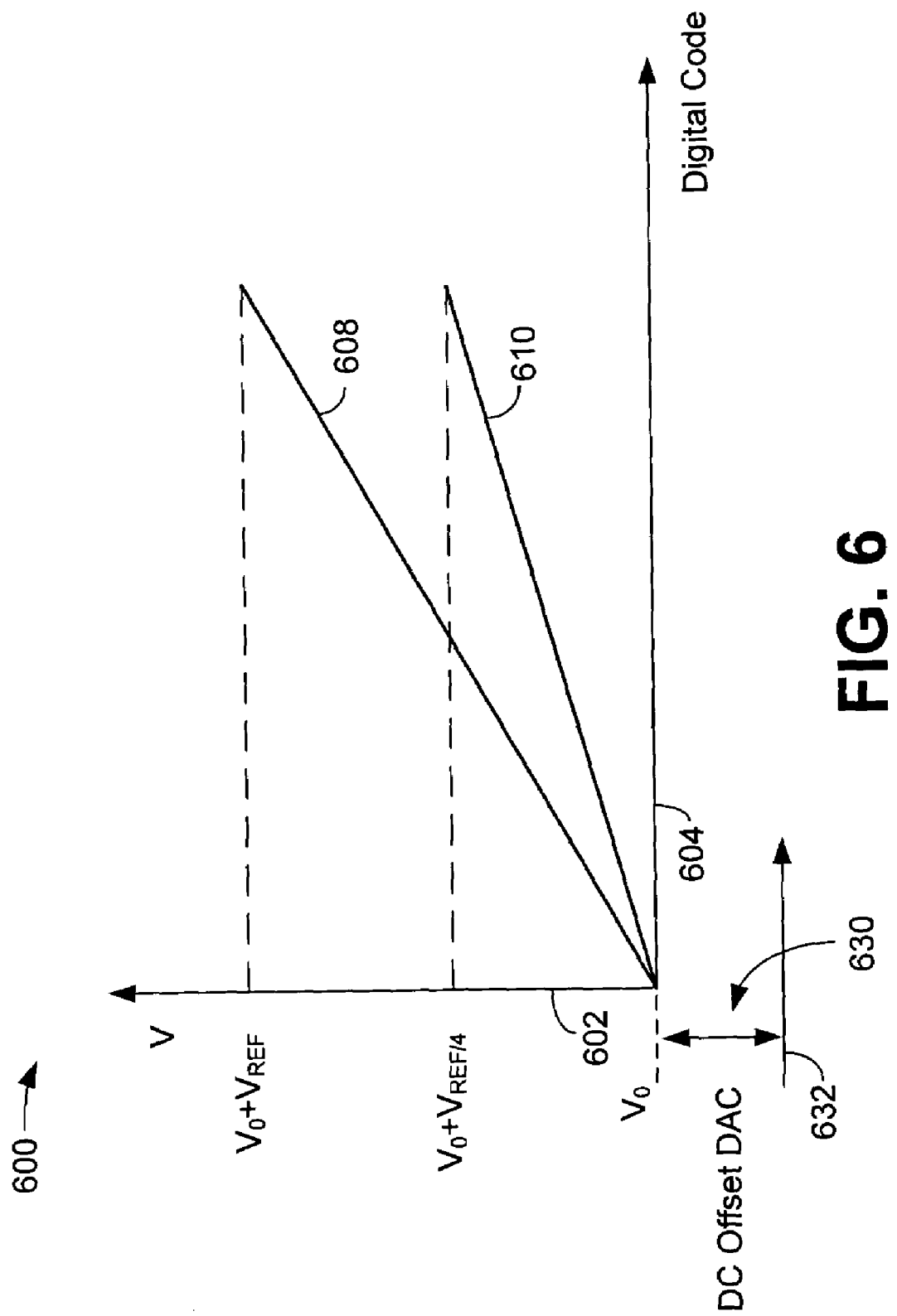
FIG. 6 is a graph showing the effect of the digital DC offset logic of FIG. 3.

FIG. 6 is a graphical illustration 600 showing the operation of the digital DC offset logic 332 of FIG. 3. The vertical axis 602 represents the level of the reference voltage signal supplied to the DAC and the horizontal axis 604 represents the value of the digital code applied to the 10 bit DAC. The curve 608 illustrates the relationship between the DAC input code and DAC output voltage for the DAC system 300 using a reference voltage of $V_{REF}$. The curve 610 illustrates the operation of the DAC system 300 using a reference voltage of $V_{REF/4}$. The line 632 represents zero volts at the output of the DAC. The digital DC offset logic 332 is programmable by the baseband subsystem 110 to provide a programmable DC offset to fine tune the DC offset of the DAC system 300.

Figure 7A:
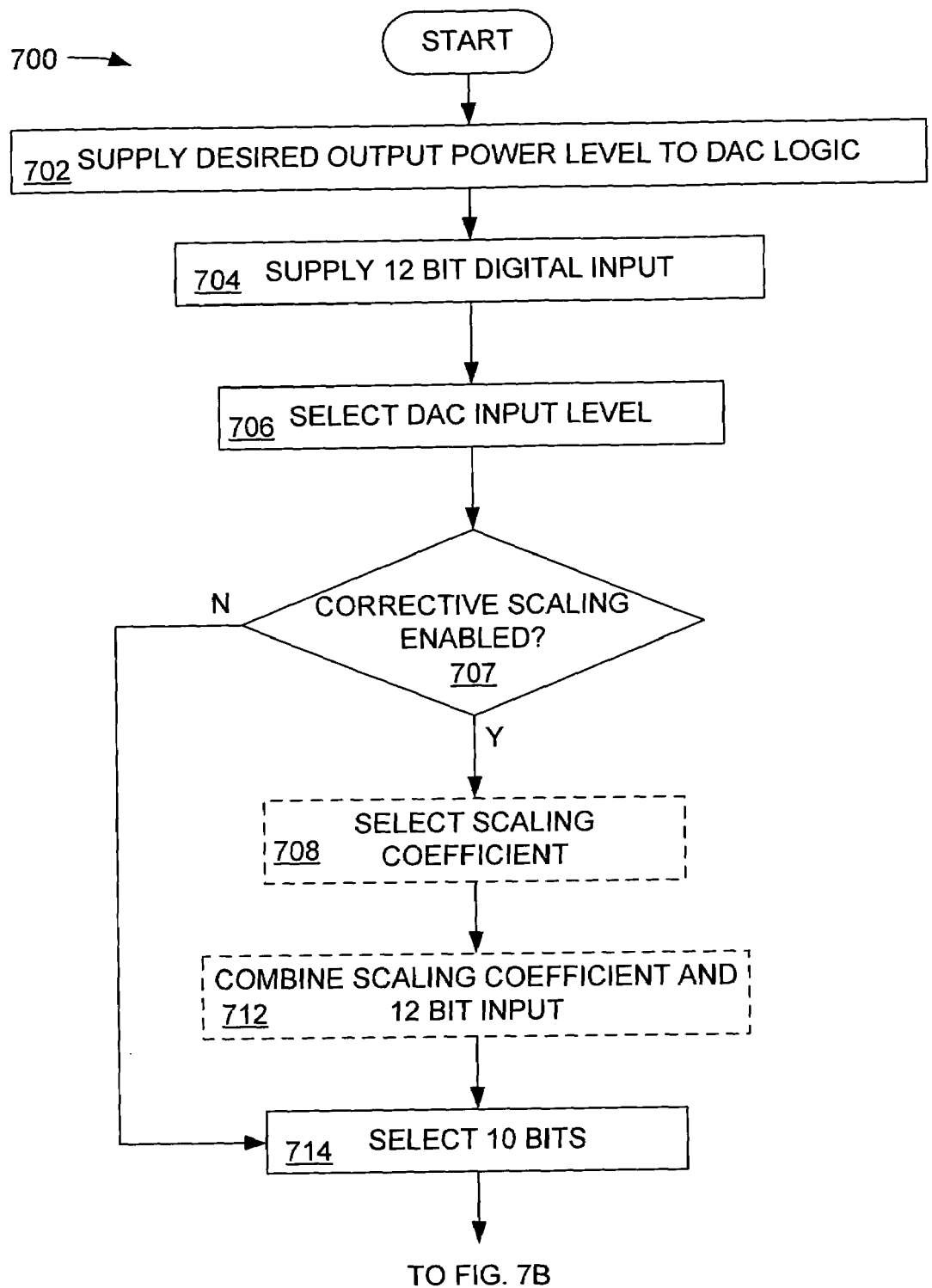
FIGS. 7A and 7B are a flow chart describing the operation of an embodiment of the system for reducing amplitude DAC resolution.
Figure 7B:
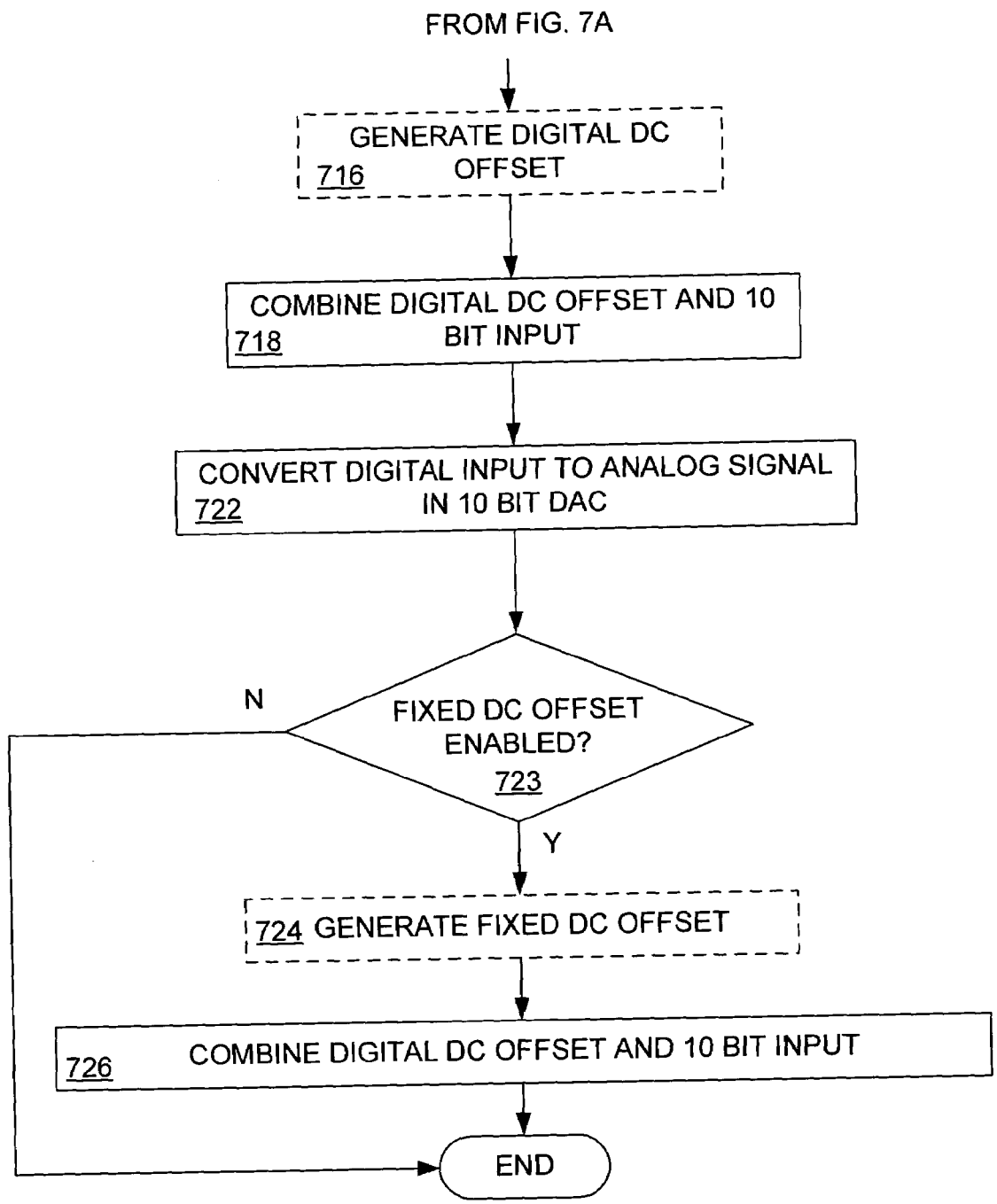

FIGS. 7A and 7B are a flow chart 700 describing the operation of an embodiment of the system for reducing amplitude DAC resolution. The blocks in the flow chart 700 illustrate one possible manner of implementing the system for reducing amplitude DAC resolution and can be executed in the order shown, out of the order shown or substantially in parallel. In block 702 a signal representing the desired power output of the power amplifier 160 is supplied to the DAC logic 304 (FIG. 3). In block 704 a 12 bit digital input signal representing the AM portion of the transmit signal is supplied to the DAC system 300. In block 706, the DAC input level selection logic 310 determines the desired transmit power level and based thereon determines the appropriate DAC reference voltage level. For example, the transmit power can be divided into a number of ranges with each range having a corresponding DAC reference voltage level. In block 707 it is determined whether the optional scaling coefficient logic 316 is implemented.

If the scaling coefficient logic 316 is implemented, then, in block 708, the scaling coefficient logic 316 digitally compensates for inaccuracy in the ratio of the different DAC reference voltage levels due to, for example, differences in manufacturing tolerances, or the like. In block 712, the output of the scaling coefficient logic 316 is multiplied with the 12 bit input signal supplied in block 704.

In block 714, the 10 bit selection logic 326 selects 10 bits from the 12 bits supplied. If the scaling coefficient logic 316 is not used, then the process proceeds directly from block 707 to block 714. In block 716, the digital DC offset logic 332 generates a digital DC offset signal to compensate for quantization noise present in the DAC system 300. In block 718, the digital DC offset signal is combined with the output of the 10 bit selection logic 326. In block 722, the 10 bit digital signal is converted to the analog domain by the 10 bit DAC 344. In block 723 it is determined whether the fixed DC offset logic 346 is enabled. If the fixed DC offset logic 346 is implemented, then, in block 724, the fixed DC offset logic 346 generates a fixed DC offset signal. In block 724, the fixed DC offset signal is combined with the output of the 10 bit DAC 344 and delivered to the DAC LPF 248 (FIG. 2) via connection 246 (FIG. 2) and thereafter to the gain control input 172 of the power amplifier 160. If the fixed DC offset logic 346 is omitted, then the output of the 10 bit DAC (block 722) is supplied directly to the DAC LPF 248 (FIG. 2) and thereafter to the gain control input 172 of the power amplifier 160. It should be mentioned that a DAC resolution of 12 and 10 bits is used herein for example purposes only to illustrate embodiments in accordance with the invention. The invention is not limited to the specific DAC resolution described, but instead is applicable in general to any DAC resolution, depending on system parameters.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for reducing digital-to-analog converter (DAC) resolution for an amplitude modulated signal, comprising:
    receiving a signal representative of a desired DAC output voltage range;
    selecting a reference value corresponding to the desired DAC output voltage range;
    supplying the reference value to a digital-to-analog converter (DAC);
    receiving an amplitude modulated signal comprising a plurality of digital bits;
    selecting a portion of the digital bits to represent the amplitude modulated signal; and
    converting the portion of the digital bits into an analog signal using the selected reference voltage level to drive the DAC, wherein the DAC performs a power control function for a power amplifier.

2. The method of claim 1, wherein the desired DAC output voltage range is divided into a plurality of ranges and the reference value is divided into a corresponding number of values.

3. The method of claim 2, wherein the plurality of digital bits is 12 and the portion of digital bits is 10.

4. The method of claim 2, further comprising scaling the desired DAC output voltage range signal to digitally compensate for inaccuracy in the ratio of the different reference voltage levels.

5. The method of claim 4, further comprising providing a digital DC offset value to compensate for quantization noise.

6. The method of claim 1, wherein the desired DAC output voltage range corresponds to a desired transmit power level.

7. A system for reducing digital-to-analog converter (DAC) resolution for an amplitude modulated signal, comprising:
    a first logic configured to determine a desired DAC output voltage range;
    a second logic configured to select a DAC reference voltage level corresponding to the desired DAC output voltage range;
    a third logic configured to select a number of digital bits for conversion to the analog domain, the number of bits chosen from a larger number of digital bits; and
    a DAC configured to receive the selected DAC reference voltage level and convert the selected number of digital bits to a signal in the analog domain, wherein the DAC performs a power control function for a power amplifier.

8. The system of claim 7, wherein the desired DAC output voltage range is divided into a plurality of ranges and the DAC reference voltage level is divided into a corresponding number of values.

9. The system of claim 8, wherein the larger number of digital bits is 12 and the selected number of digital bits is 10.

10. The system of claim 8, further comprising a scaling coefficient logic configured to digitally compensate for inaccuracy in the ratio of the different DAC reference voltage levels.

11. The system of claim 10, further comprising a digital DC offset logic configured to compensate for quantization noise.

12. The system of claim 7, wherein the desired DAC output voltage range corresponds to a desired transmit power level.

13. A portable transceiver having a system for reducing digital-to-analog converter (DAC) resolution for an amplitude modulated signal, comprising:
    transmit and receive circuitry;
    a first logic configured to determine a desired DAC output voltage range;
    a second logic configured to select a DAC reference voltage level corresponding to the desired DAC output voltage range;
    a third logic configured to select a number of digital bits for conversion to the analog domain, the number of bits chosen from a larger number of digital bits; and
    a DAC configured to receive the selected DAC reference voltage level and convert the selected number of digital bits to a signal in the analog domain, wherein the DAC performs a power control function for a power amplifier.

14. The system of claim 13, wherein the desired DAC output voltage range is divided into a plurality of ranges and the DAC reference voltage level is divided into a corresponding number of values.

15. The system of claim 14, wherein the larger number of digital bits is 12 and the selected number of digital bits is 10.

16. The system of claim 14, further comprising a scaling coefficient logic configured to digitally compensate for inaccuracy in the ratio of the different DAC reference voltage levels.

17. The system of claim 16, further comprising a digital DC offset logic configured to compensate for quantization noise.

18. The system of claim 17, wherein the desired DAC output voltage range corresponds to a desired transmit power level.

* * * * *